United States Patent

Baumgardner et al.

Patent Number: 5,846,662
Date of Patent: *Dec. 8, 1998

[54] RELEASE LINERS FOR MOLDED PRODUCT PRODUCTION

[75] Inventors: John S. Baumgardner, deceased, late of Aspers, by Patricia A. Baumgardner, executrix; Merle W. Barclay, Mt. Holly Springs, both of Pa.

[73] Assignee: Ahlstrom Filtration, Inc., Mt. Holly Springs, Pa.

[*] Notice: The term of this patent shall not extend beyond the expiration date of Pat. No. 5,709,931.

[21] Appl. No.: 856,519

[22] Filed: May 15, 1997

(Under 37 CFR 1.47)

Related U.S. Application Data

[63] Continuation-in-part of Ser. No. 512,780, Aug. 9, 1995, Pat. No. 5,709,931.

[51] Int. Cl.⁶ ..................................................... B32B 21/06
[52] U.S. Cl. .......................... 428/535; 428/218; 428/534
[58] Field of Search .................................... 428/218, 534, 428/535; 442/373

[56] References Cited

U.S. PATENT DOCUMENTS 4,166,150  8/1979  Mattor et al. .

OTHER PUBLICATIONS

Montecell Chromium Complex Product Sheets, 1989; Seppic S.A., Paris, France.

*Primary Examiner*—Helen L. Pezzuto
*Attorney, Agent, or Firm*—Nixon & Vanderhye P.C.

[57] ABSTRACT

A mold release liner for a heated pressure mold for making products such as printed circuit boards is made utilizing two or more wet-laid fiber layers of cellulose or cellulose derivative fibers (such as wood, cotton, cellulose acetate, or rayon fibers, or mixtures of these). The first layer has a sufficiently low density so that it acts as a cushion and absorbs deformation when used as a release liner in the mold (typically it has a thickness of between 8–250 mils, most desirably 40–90 mils, and a basis weight of about 25–350 pounds per ream, most desirably 130–160 pounds per ream). A second layer is of much higher density than the first layer and readily releases from the molds, for example comprising condenser tissue or a similar product, having a thickness of between 0.5–10 mils and a basis weight of 4–50 pounds per ream of 500 sheets. The first and second layers are in face-to-face engagement with each other, and may be adhesively laminated together with sheet, spray, liquid, or powder adhesive. A third layer, substantially like the second layer but on the opposite side of the first face, may also be provided. The second and third layers may have a chromium complex release agent applied to them.

26 Claims, 4 Drawing Sheets

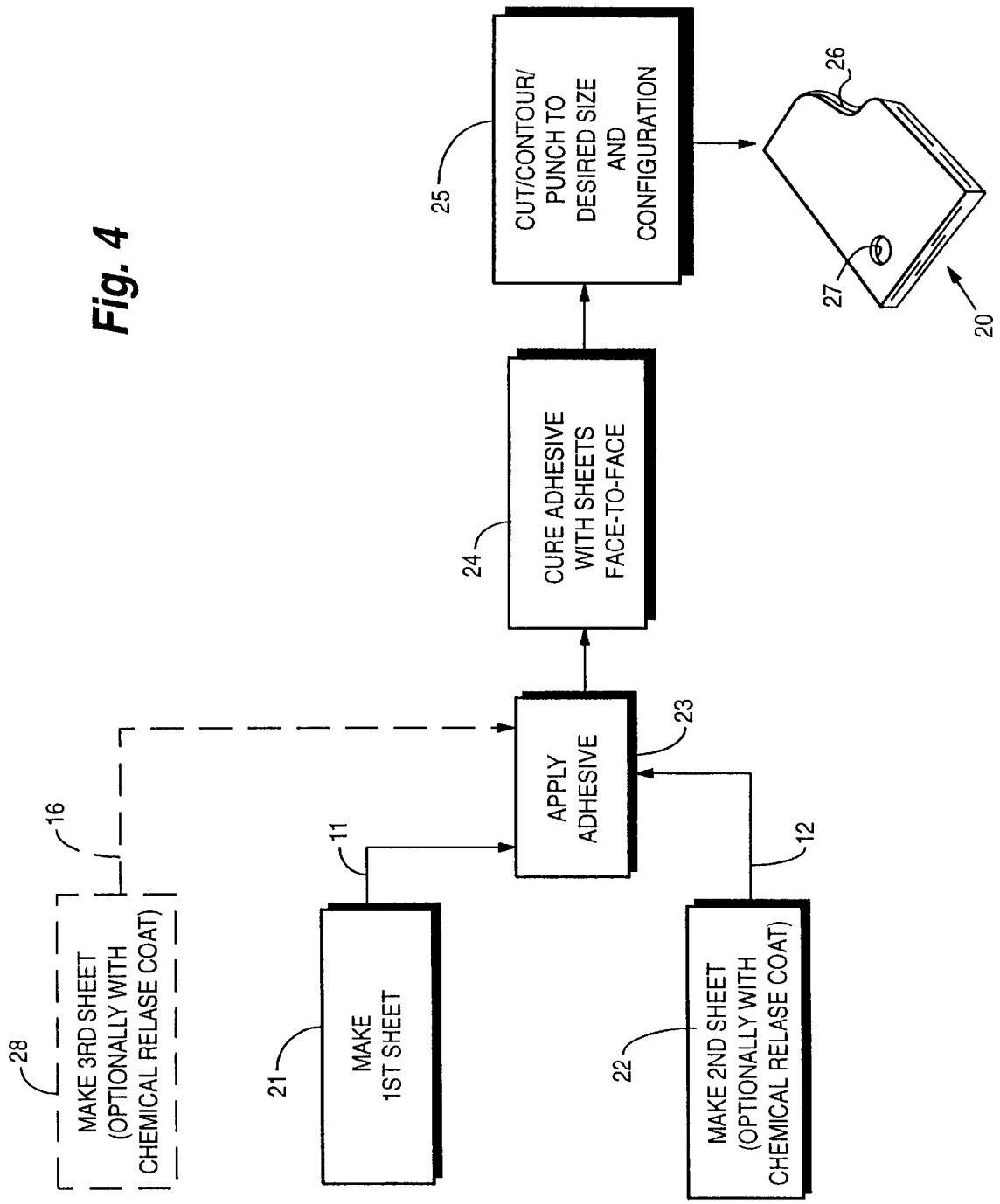

heat, pressure

RELEASE LINERS FOR MOLDED PRODUCT PRODUCTION

CROSS-REFERENCE TO RELATED APPLICATION

This application is a continuation-in-part of Ser. No. 08/512,780 filed Aug. 9, 1995, now U.S. Pat. No. 5,709,931.

BACKGROUND AND SUMMARY OF THE INVENTION

Release liners are important elements in the manufacture of many products utilizing heat and pressure molds. For example, in the manufacture of printed circuit boards, such as shown in U.S. Pat. No. 5,256,474 (the disclosure of which is hereby incorporated by reference herein) within a mold printed circuit boards having prepreg (including, typically, epoxy) are layered between stainless steel plates, with release liners provided between the stainless steel plates, and the metal press plate, the release liners having sufficient properties so that they readily release once the final printed circuit board has been formed and is to be removed from the mold. Many types of release liners, especially those used commercially in significant quantities, include a non-fibrous film structure made of a material that has natural release properties or films that have been treated by chemical agents or the like to develop release properties. However, these products are not always desirable from the cost of manufacture or environmental standpoint, and it is desirable to be able to make effective release liners simply using "paper" (that is, of cellulose or cellulose derivative fibers).

U.S. Pat. No. 4,884,337 suggests using tissue paper as a porous release sheet in contact with a surface through which vacuum is drawn, however the nature of the tissue paper is not described. If the tissue paper has sufficient release properties, such as condenser tissue, it may not adequately cushion the part being molded by the application of heat and pressure, or absorb deformities, which can be particularly important in the molding of certain products such as printed circuit boards. If the release sheet is simply of super-calendered, clay coated, natural kraft paper with a silicone release layer on the clay coating, such as described in U.S. Pat. No. 5,256,474, the cost and difficulty of manufacture in order to provide both cushioning and release properties are high.

According to the present invention, a release liner, a method of utilization of the release liner in the production of molded products such as printed circuit boards, and method of manufacture of a release liner, are provided which have significant distinctions and advantages compared to conventional prior art release liners and methods of production thereof. The release liners according to the present invention may be made simply utilizing conventional paper making equipment and do not require release films or the like. This way the release liners according to the invention are inexpensive, and environmentally friendly. Also, their properties are readily variable by simply controlling the normal parameters in the paper making processes and equipment.

According to one aspect of the present invention a heat and pressure mold release liner is provided comprising the following elements: A first dry-laid or wet-laid fiber layer of cellulose or cellulose-derivative fibers, the first layer having a thickness of between 8–250 mils and a basis weight of 25–350 pounds per ream of 500 20 inch by 20 inch sheets. A second wet-laid fiber layer of cellulose or cellulose-derivative fibers of higher density than the first layer, the second layer having a thickness of between 0.5–10 mils and a basis weight of 4–50 pounds per ream of 500 20 inch by 20 inch sheets. And the first and second layers in face-to-face engagement with each other. Preferably the release liner consists of the recited elements (which may include an adhesive to laminate them together), being devoid of polymeric films, or the like, although the second layer may have other fibers (e.g. wool synthetic) which enhance the release properties of the second layer.

In the preferred embodiment the first layer has a thickness of about 40–90 mils and a basis weight of about 130–160 pounds per ream, and the densities in each of the layers are substantially uniform across the entire extents thereof, with the density of the second layer typically being at least two times that of the first layer. The fibers typically comprise wood (softwood or hardwood), cotton, or vegetable fibers, or cellulose derivative fibers such as cellulose acetate, rayon, and a wide variety of other commercially available cellulose derivative fibers. The cellulose or cellulose-derivative fibers may be provided in various mixes to enhance the desired properties.

Desirably an adhesive laminates the first and second layers together. The adhesive may be polyolefin, polyester, polyamide or hot melt adhesive, starch, or any adhesive that is compatible with the production process, and it may be in sheet, epoxy, liquid, or powder form. Polyamide adhesive is preferred, particularly in sheet form. For example, polyamide fibers in sheet form may be provided between the first and second layers, and the composite passed through a heated calender with low pressure, the heat being applied—combined with the low pressure—being sufficient to soften the polyamide fibers and hold the cellulose or cellulose-derivative fibers of the first and second layers permanently together. In some circumstances it may be desirable to provide a third layer substantially like the second layer but in engagement with the opposite face of the first layer from the second layer. The third layer also is preferably held to the first layer with an adhesive, such as polyamide.

The first and second layers are typically made with a paper machine (such as a Fourdrinier), and density of each of the layers can be controlled by heating, pressing, forming, and calendering adjustments as is conventional. That is, beaters or pulpers disperse the fibers in the water, and the refiners and/or beaters are used to develop the fibers to the desired length and fibrillation levels to develop the required properties. That is, according to this aspect of the present invention a method of producing release liners is provided comprising the following steps: (a) Forming with a paper machine a first wet-laid fiber layer of cellulose or cellulose derivative fibers, the first layer having a thickness of between 8–250 mils and a basis weight of 25–350 pounds per ream of 500 20 inch by 20 inch sheets. (b) Forming with a paper machine a second wet-laid fiber layer of cellulose or cellulose derivative fibers of higher density than the first layer, the second layer having a thickness of between 0.5–10 mils and a basis weight of 4–50 pounds per ream of 500 20 inch by 20 inch sheets. (c) Placing the first and second layers in face-to-face engagement with each other. And (d) either prior to or after step (c), cutting and forming the layers to a size and configuration that fits a heat and pressure mold in which the layers are to be used as a release liner. Also, to facilitate release from the mold one or both of the outer layers (regardless of how many layers are present) are provided (e.g. coated or impregnated) with a chemical release agent.

A chromium complex is the preferred basic constituent of the chemical release agent. Two commercially available chromium complexes are sold under the trade names "Montecell L" (CAS Registry No. 15242-96-3) and "Montecell CF" (CAS Registry No. 65229-24-5). Montecell L is predominately octedecan te chromic chloride hydroxide (1:2:4:1), while Montecell CF is chromium pentahydroxy (tetradecamoato) di-. Both are available froom Seppic S.A. of Paris, France. Other commercially available chromium complexes may also be used, however, such as QUILON sold by E. I. duPont (see U.S. Pat. No. 4,166,150), which comprises a series of Werner type chromium complexes of a fatty acid (e.g. stearic or myristic).

The chromium complex is applied as part of a release coat (or impregnation) comprising, and preferably consisting essentially of (i.e. containing no significant amount of any other active ingredient, such as cross linkable thermosetting resin), the chromium complex and a buffer solution. The buffer solution is for pH control and preferably comprises a technical urea solution e.g. one containing technical urea, formate of sodium, formic acid, and water. The buffer solution and chromium complex may be mixed with additional water, and applied as an aqueous phase to a layer of cellulose or cellulose derivative fibers at a rate of 0.2–1.5 gms of chromium complex/$m^3$ of layer volume. The solution may be applied using any suitable conventional application method, such as size press, tamp-on, or dip and squeeze. The exact application rate and technique, the particular chromium complex utilized, and/or the amount of pH adjustment, will all depend upon the particular nature of the layers of the release liner, and the particular mold or products.

According to another aspect of the present invention a release liner (such as described above) is used to produce a molded product in a mold press. The first layer has a sufficiently low density so that it acts as a cushion and it absorbs deformation (which is particularly important where the product being produced has an uneven configuration or surface, such as a printed circuit board), while the second layer has a sufficiently high density so that it releases from the separator plate. The method comprises the following steps: (a) Placing a product, with prepreg, to be molded in the mold and placing the release liner second layer in contact with the separator plate. (b) Applying above ambient heat and pressure to the product with prepreg with the mold over a sufficient period of time to form the molded product from the product with prepreg, the first layer of the release layer absorbing deformities and cushioning the second layer during the application of heat and pressure. And (c) removing the molded product from the mold, the second layer readily releasing from the separator plate.

In the method as described above, it is preferably practiced to make printed circuit boards or the like, and typical conditions in the practice of step (b) are a pressure of about 300–600 psi, a temperature of between about 200°–400° F., and a time of about one to three hours.

It is a primary object of the present invention to provide a release liner, and method of manufacture and utilization thereof, which provides adequate uniform compression during the molding operation, as well as well as uniform heat transfer from the press to the products being molded, and that can be manufactured in a simple manner and does not require the use of polymeric film. This and other objects of the invention will become clear from an inspection of the detailed description of the invention and from the appended claims.

BRIEF DESCRIPTION OF THE DRAWINGS

FIG. 3A is a view like that of FIG. 2 only showing the final configuration of a third embodiment of the release liner according to the present invention, while

FIG. 4 is a schematic representation of an exemplary method of producing release liners according to the present invention.

DETAILED DESCRIPTION OF THE DRAWINGS

Figure 1:
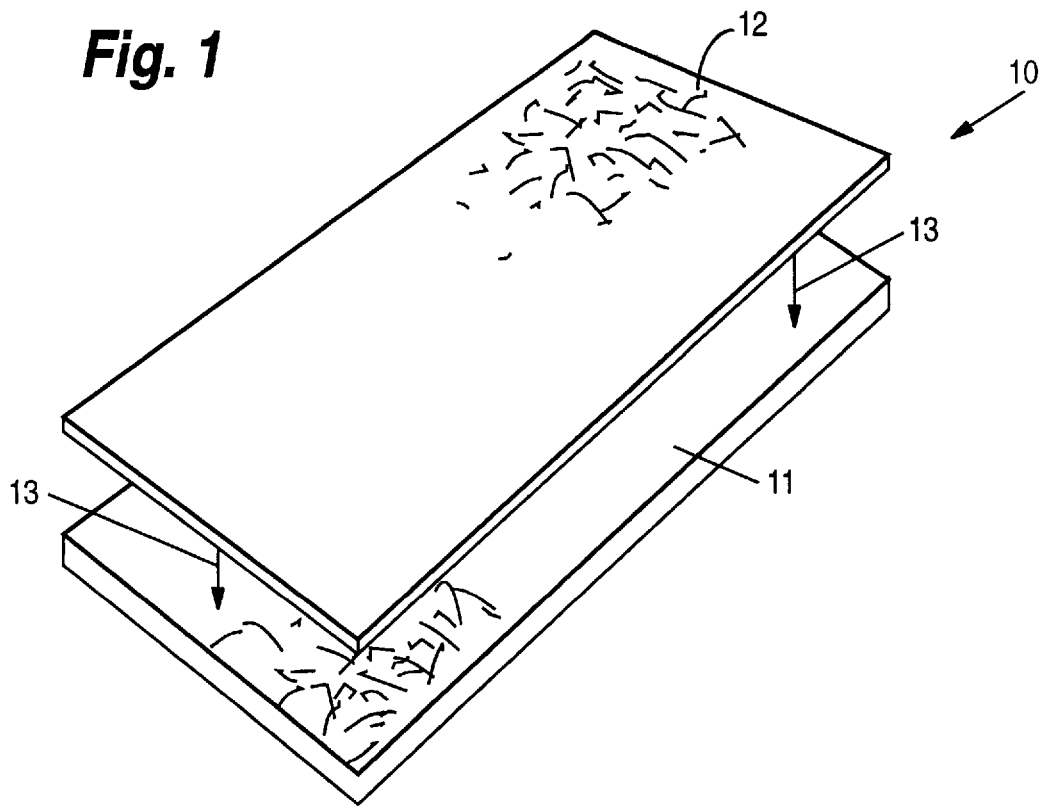
FIG. 1 is a top perspective view of two layers of cellulose or cellulose derivative fibers being brought into face-to-face engagement with each other to produce a first embodiment of release liner according to the present invention.

FIG. 1 schematically illustrates a release liner 10 according to one embodiment of the present invention. The release liner includes a first layer 11 and a second layer 12. The first layer 11 is a dry-laid or (preferably) wet-laid fiber layer of cellulose or cellulose-derivative fibers. Typically cellulose or cellulose-derivative fibers according to the present invention include wood (both hardwood and softwood), cotton, or vegetable fibers, or cellulose acetate, rayon, or like cellulose-derivative fibers. The purpose of the first layer 11 in the final release liner 10 is to provide cushioning during application of heat and pressure of the mold, to absorb deformities, while seeing to adequate uniform compression and adequate uniform heat transfer. For this purpose the first layer 11 typically has a thickness of between 8–250 mils, preferably between 40–90 mils, and a basis weight of 25–350 pounds per ream of 500 20 inch by 20 inch sheets, preferably a basis weight of between 130–160 pounds per ream. In the preferred embodiment the first layer 11 is made on a conventional paper machine such as a Fourdrinier.

The second layer 12 is a wet-laid layer of cellulose or cellulose-derivative fibers that has higher density than the first layer. The density of the second layer 12 must be high enough so that it readily releases from the separator plate when used as a release liner. In the preferred embodiment the second layer 12 has a thickness of between 0.5–10 mils, and a basis weight of 4–50 pounds per ream of 500 20 inch by 20 inch sheets. Typically the density of the second layer 12 is much greater than that of the first layer 11, e.g. on the order of at least about two times greater. Conventional condenser tissue or parchment paper may be suitable as the second layer 12. [Parchment paper is prepared by passing paper through sulfuric acid, which causes the fibers to swell and the paper to become transparent.]

As illustrated in FIG. 1 by the arrow 13, the layers 11, 12 (which have substantially the same length and width) move into face-to-face engagement with each other to produce the release liner 10. While in the preferred embodiment according to the invention there is some mechanism for holding the layers 11, 12 together for ease of handling, even if a temporary mechanism (such as a paper clip or the like), the sheets 11, 12 may not necessarily be adhered to each other to form the release liner, but rather the sheets 11, 12 will act as an appropriate and effective release liner even if unconnected.

Figure 2:
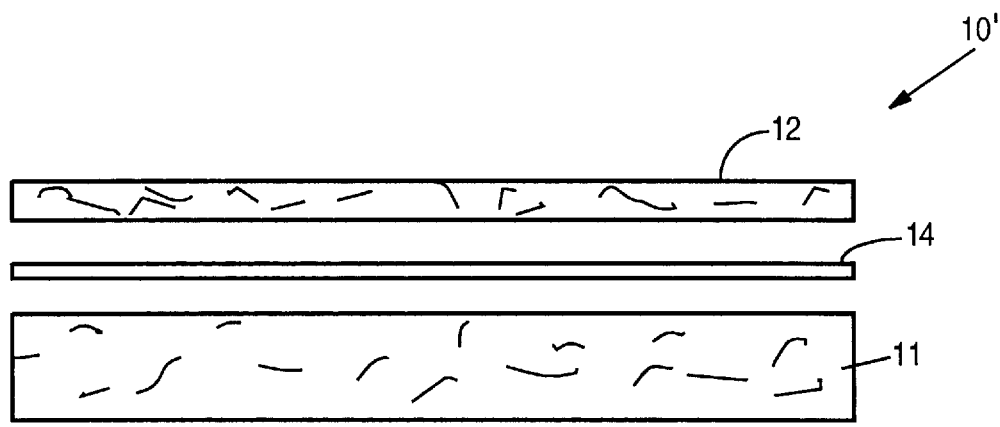
FIG. 2 is a side view, with the thickness dimensions of the components greatly exaggerated for clarity of illustration, of a second embodiment of release liner being assembled, but before final production thereof.

FIG. 2 shows, during the process of construction, a preferred manner of laminating the layers 11, 12 together to produce a second embodiment of release liner 10' according to the invention. In this embodiment a polyamide and/or polyester sheet 14 (which has a thickness of less than the sheets 11, 12 and is typically non-woven) and of substantially the same length and width dimensions as the layers 11, 12 is placed between them. That composite is then passed through a heated calender with low pressure. The low pressure coupled with heat sufficient to soften the polyamide and/or polyester fibers in the non-woven sheet 14 results in the polyamide and/or polyester fibers adhering to both the layers 11, 12 and adhesively substantially permanently connecting them together. Polyamide sheets are preferred.

The adhesive that is utilized according to the present invention to produce a laminate need not be in sheet form, but may be also in spray, liquid, or powder form, or any other like form as long as it properly functions to hold the sheets 11, 12 without adverse affect on the molding process. Other adhesives that can be used besides polyamide or polyester include polyolefin, hot melt adhesives, starch, or any adhesive that is compatible with the production process.

Figure 3A:
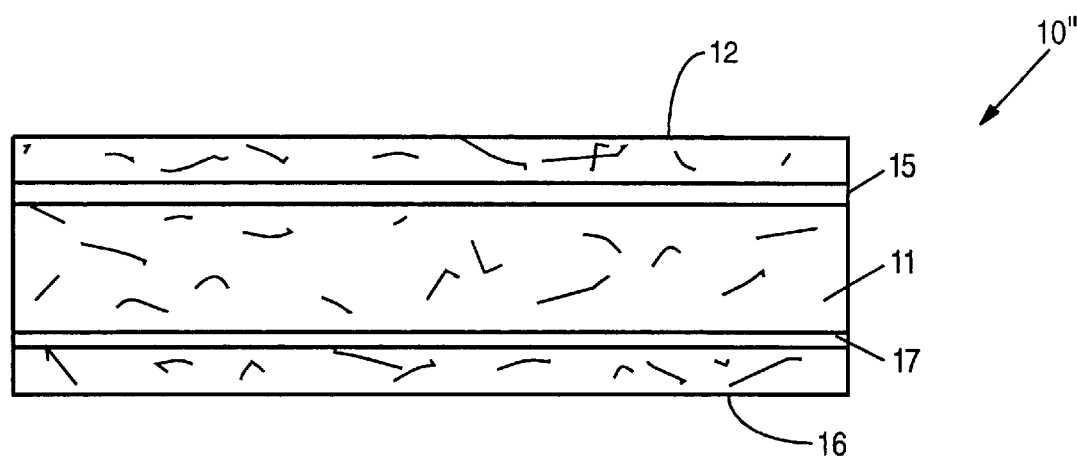

FIG. 3A schematically illustrates a third release liner 10" according to the invention, in assembled construction. The release liner 10" includes a first layer 11 and a second layer 12 with an adhesive 15 between them. The use of layer 15 may comprise the melted form of the polyamide non-woven sheet 14 or may comprise any of the other materials in any of the other configurations such as described above.

In the FIG. 3A embodiment the common release liner 10" also is different from the FIGS. 1 and 2 embodiments in that a third layer 16 is provided. The third layer 16 is substantially the same as the first layer 12, although the layers 12, 16 need not be identical in the final release liner 10' (although they are within the same range of thickness and density such as described above). FIG. 3A also shows a suitable adhesive layer 17, like the layer 15 (although of course the chemical construction and physical form of the adhesive may be different).

Figure 3B:
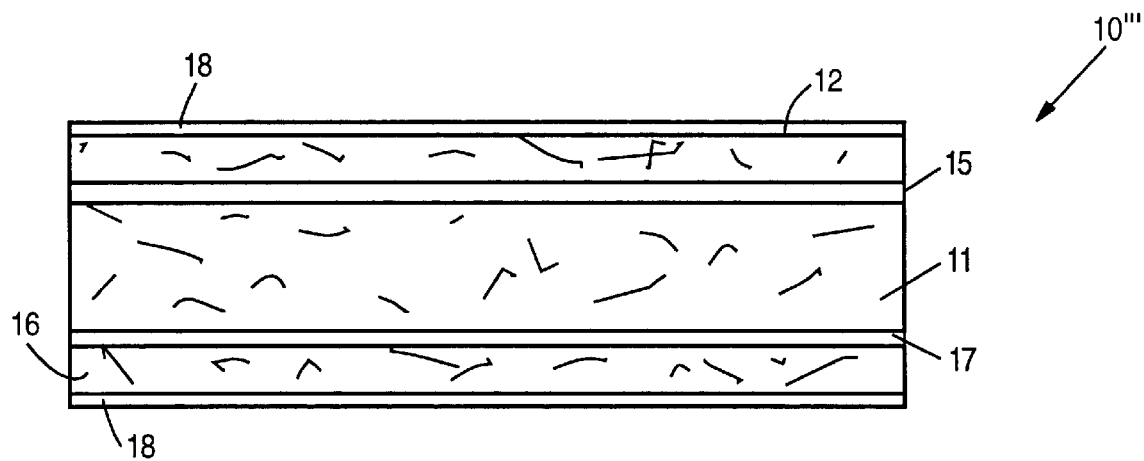
FIG. 3B is like FIG. 3A only for a fourth embodiment.

In the FIGS. 2 and 3A embodiments, the outer surfaces of the layers are devoid of any chemical release agent. However, if desired a chemical release agent may be used. This is schematically illustrated in the FIG. 3B embodiment, wherein a chromium complex coating or impregnating release agent is provided as illustrated schematically at 18 for the release liner 10'". While the release agent 18 is illustrated associated with both outer layers in FIG. 3B, it can be provided in association with only one of the layers 12, 16. A release agent 18 could also be provided with the layer 12 in the FIG. 2 embodiment (a chemical release agent would not normally be associated with layer 11 in FIG. 2).

One particularly desirable way to make and apply a release agent 18 is to make an aqueous buffered solution of a chromium complex (such as using the Montecell or Quilon chromium complexes described above, such as octedecante chromic chloride hydroxide or chromium pentahydroxy (tetradecamoato) di-), e.g. buffered with a urea containing buffer, and applying the solution to the outer layer or layers 12 and 16. The application rate is preferably about 0.2–1.5 (e.g. about 0.7–1.0) grams of chromium complex per cubic meter of the layer 12, 16, and any suitable and conventional application technique may be used, such as dip and squeeze, tamp-on, or size press. The layer 12, 16 is dried before further processing.

FIG. 4 schematically illustrates the method of making a release liner according to the present invention. The release liner made by the method of FIG. 4 is shown schematically at 20 in FIG. 4.

The first step is to make a first sheet/layer 11, which is illustrated schematically by box 21 in FIG. 4. As described above, this is preferably done on a conventional paper machine, such as a Fourdrinier. Cellulose or cellulose-derivative fibers are dispersed in water, such as utilizing beaters or pulpers, and refiners or beaters are used to develop the fiber to the desired length and fibrillation levels needed to develop the desired properties of the final sheet 11 to be produced. The density of the sheet is controlled by beating, refining, pressing, and calendering, and the density may be varied as desired. The density properties of the sheet 11 made by the first step illustrated schematically at 21 in FIG. 4 are as described above.

At the same time, prior to or after the manufacture of first sheet 11 the second sheet 12 is manufactured, and is illustrated schematically at box 22 in FIG. 4. Box 22 also preferably schematically illustrates a conventional paper making machine such as a Fourdrinier, but of course the machine is controlled so that the density of the sheet 12 is much greater than the first sheet 11, and its thickness less. The chemical release agent 18, when used, is preferably applied after the sheet 12 is made, and before the sheets 11, 12 are brought together.

The method schematically illustrated in FIG. 4 also includes the box/step 23 in which adhesive is applied. The adhesive may be sprayed on, a non-woven sheet such the sheet 14 illustrated in FIG. 2 may be utilized and the composite passed through a calender, or any other conventional manners of applying adhesive may be utilized. The adhesive is secured as illustrated schematically in box 24, such as automatically occurs when the calendering operation of the non-woven sheet 14 is used and then subsequently cooled, or any other conventional curing techniques may be utilized depending on the particular adhesive involved. Alternatively, but less desirably, the chemical release agent 18 may be applied after stage 24.

Either before the stage 23, or preferably after the stage 24, the sheets 11, 12 (which may be in web form at the time) are cut, contoured and/or punched to the desired size or configuration as illustrated schematically by box 25 in FIG. 4. This is accomplished utilizing conventional tools such as cutting blades, die punches, die cutters, or the like. Depending upon a particular mold the final release liner 20 will be cut to particular dimensions and may have one or more portions thereof contoured such as illustrated schematically at 26 in FIG. 4, and one or more holes such as illustrated schematically at 27 punched therein. The contour 26 and/or holes 27 would be provided so as to conform to the particular configuration/tools of the mold with which the release liner 20 is utilized, or the particular configurations of the products to be molded.

FIG. 4 also illustrates—in dotted line—construction of the third sheet (like the sheet 16 in FIG. 3) by box 28, the third sheet typically laminated to the first sheet 11 at the same time that the second sheet 12 is, as indicated schematically by the arrow extending from box 28 to box 23 in FIG. 4. The third sheet 16 also may optionally be provided with a release agent 18 after it is made and before box 23.

Figure 5:
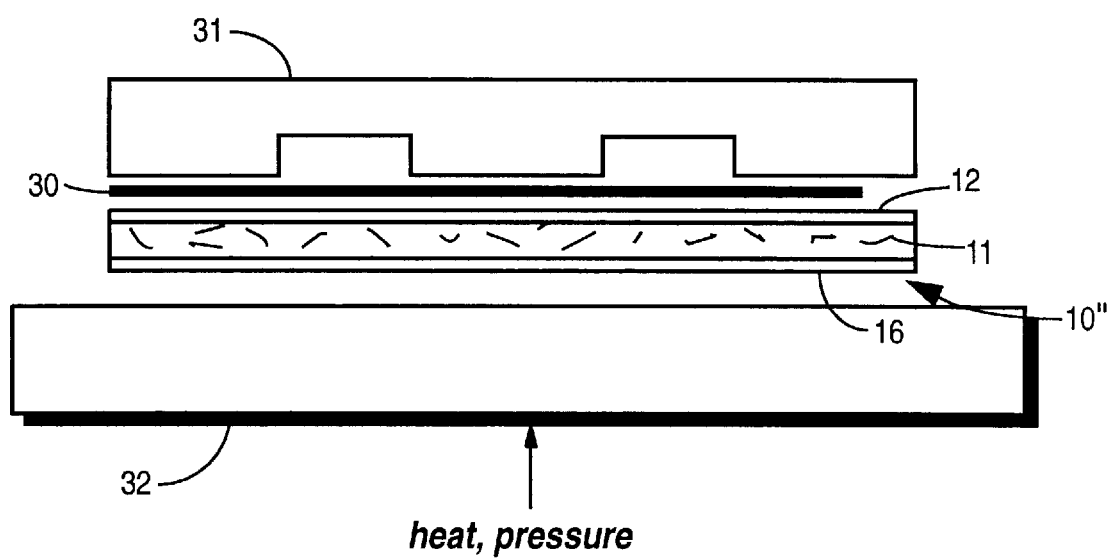
FIG. 5 is a schematic side exploded view (with dimensions of the release liner greatly exaggerated for clarity of illustration) showing the typical use of a release liner in a method of producing molded products according to the invention.

FIG. 5 schematically illustrates an exemplary manner of utilization of the release liner according to the present invention, in this case showing the release liner 10". The release liner 10" is used in association with a plate (such as a stainless steel plate) 30, and a product to be molded, such as a printed circuit board 31 having prepreg (typically epoxy). While the release liner 10" is shown as between the plate 30 and the press plate 32, since the release liner 10"

illustrated in FIG. 5 has both layers 12 and 16, it actually can be also in contact with a second separator plate 30, instead of a plate 32. In any event the high density layer 12 is brought into contact with the separator plate 30. Heat and pressure are applied (e.g. a pressure of about 300–600 psi, a temperature of about 200°–400° F., and a time period of about one to three hours) to produce a final product. Once the final molded printed circuit board 31 is formed, the release sheet/liner 10" is removed from the mold, the layer 12 readily releasing from the separator plate 30, and the layer 11 having performed a cushioning function absorbing deformities.

Release liners produced according to the invention have been successfully tested. One exemplary operative example (which is not limiting) is as follows:

EXAMPLE

A wet-laid first sheet was made from a combination of about 75% pine (wood) fibers and about 25% cotton fibers on a conventional Fourdrinier with a substantially uniform thickness of about 50 mils and a substantially uniform basis weight of about 140 pounds per ream of 500 20 inch by 20 inch sheets. A second wet-laid sheet was made from about 30% cotton and about 70% pine (wood) fibers on a conventional Fourdrinier, with a substantially uniform thickness of about 5 mils and a substantially uniform basis weight of about 25 pounds per ream of 500 20 inch by 20 inch sheets. A nonwoven polyamide web of about 6 mils thick was placed between the first and second sheets, in face-to-face relationship, and passed through a calender with heat only sufficient to soften the polyamide fiber (about 420° F.), and a low pressure (about 40 psi). The polyamide web thus laminated the first and second sheets together to form a release liner (the first and second layers held together with adhesive).

The release liner was placed in a mold with the second layer in contact with a stainless steel separator plate. The prepreg in the mold was subjected to a temperature of about 375° F. and a pressure of about 550 psi for a period of time about one and one half hours. When the mold was opened, the release liner immediately released from the separator plate. The first layer had acted as a cushion and was visibly deformed, and no visible part of the second layer adhered to the separator plate or press plate.

The above-example could be repeated with the second sheet associated with about 0.7–1.0 gram/m$^3$ of chromium complex (e.g. octedecante chromic chloride hydroxide or chromium pentahydroxy (tetradecamoata) di-), before layered with the first sheet. The release liner so constructed would be expected to have even better release properties, the layer 12 immediately and completely separating from the separator plate.

It will thus be seen that according to the present invention a simple yet effective liner and methods are provided. The release liner for use with a mold for applying heat and pressure, according to the present invention, is not only simple and inexpensive to produce, but the density of each of the portions thereof may be controlled so that they are substantially uniform across the entire sheet, and they are environmentally friendly, not requiring the use of a polymeric film or the like. If desired fibers which provide enhanced release properties (e.g. wool, synthetic) may be added to the cellulose and/or cellulose-derivative fibers during manufacture of the second layer as illustrated schematically at box 22 in FIG. 4, and a chromium complex release agent applied to the second and/or third layers. The release liners according to the invention provide adequate uniform compression during molding, and adequate uniform heat transfer during molding, and not only readily release from the separator plate but also provide an effective cushioning and deformity absorbing function.

While the invention has been herein shown and described in what is presently conceived to be the most practical and preferred embodiment thereof, it will be apparent to those of ordinary skill in the art that many modifications may be made thereof within the scope of the invention, which scope is to be accorded the broadest interpretation of the appended claims so as to encompass all equivalent structures and methods.

What is claimed is:

1. A heat and pressure mold release liner comprising:
   a first dry-laid or wet-laid fiber layer of cellulose or cellulose-derivative fibers, said first layer having a thickness of between 8–250 mils and a basis weight of 25–350 pounds per ream of 500 20 inch by 20 inch sheets;
   a second wet-laid fiber layer of cellulose or cellulose-derivative fibers of higher density than said first layer, said second layer having a thickness of between 0.5–10 mils and a basis weight of 4–50 pounds per ream of 500 20 inch by 20 inch sheets; said first and second layers in face-to-face engagement with each other; and
   a chemical release agent applied to said second layer.

2. A release liner as recited in claim 1 further comprising adhesive laminating said first and second layers together.

3. A release liner as recited in claim 2 wherein said adhesive comprises sheet or powder polyamide.

4. A release liner as recited in claim 1 wherein said chemical release agent comprises a chromium complex.

5. A release liner as recited in claim 1 wherein said chemical release agent consists essentially of a buffered chromium complex.

6. A release liner as recited in claim 4 wherein said chromium complex is octedecante chromic chloride hydroxide or chromium pentahydroxy (tetradecamoata) di-, applied at the rate of 0.2–1.5 gm/m$^3$.

7. A release liner as recited in claim 5 wherein said chromium complex is octedecante chromic chloride hydroxide or chromium pentahydroxy (tetradecamoata) di-, applied at the rate of 0.2–1.5 gm/m$^3$.

8. A release liner as recited in claim 1 further comprising a third wet-laid fiber layer of cellulose or cellulose-derivative fibers having a density greater than that of said first layer, said third layer having a thickness of between 0.5–10 mils, and a basis weight of 4–50 pounds per ream of 500 20 inch by 20 inch sheets, said third layer in face-to-face engagement with said first layer on the opposite face thereof from said second layer.

9. A release liner as set forth in claim 4 further comprising an adhesive laminating said third layer to said first layer.

10. A release liner as recited in claim 8 further comprising a chemical release agent applied to said third layer.

11. A release liner as recited in claim 10 wherein said chemical release agents applied to said second and third layers comprises a chromium complex.

12. A release liner as recited in claim 11 wherein said chemical release agent consists essentially of a buffered chromium complex.

13. A release liner as recited in claim 12 wherein said chromium complex is octedecante chromic chloride hydroxide or chromium pentahydroxy (tetradecamoata) di-, applied at the rate of 0.2–1.5 gm/m$^3$.

14. A release liner as recited in claim 1 wherein said first layer has a thickness of about 40–90 mils, and a basis weight of about 130–160 pounds per ream.

15. A release liner as recited in claim 8 wherein said density of each of said second and third layers is at least two times that of said first layer.

16. A release liner as recited in claim 1 wherein said second layer comprises condenser tissue or parchment paper.

17. A release liner as set forth in claim 1 wherein said cellulose or cellulose-derivative fibers are cotton, vegetable, cellulose acetate, or rayon fibers, or mixtures thereof, or with wood fibers.

18. A release liner as recited in claim 1 wherein said cellulose or cellulose derivative fibers include wood fibers.

19. A release liner as recited in claim 4 wherein said first layer has a thickness of about 40–90 mils, and a basis weight of about 130–160 pounds per ream.

20. A release liner as recited in claim 4 wherein said second layer comprises condenser tissue or parchment paper.

21. A release liner as set forth in claim 4 wherein said cellulose or cellulose-derivative fibers are cotton, vegetable, cellulose acetate, or rayon fibers, or mixtures thereof, or with wood fibers.

22. A release liner as recited in claim 18 wherein said cellulose or cellulose derivative fibers include wood fibers.

23. A release liner as recited in claim 8 wherein said first layer has a thickness of about 40–90 mils, and a basis weight of about 130–160 pounds per ream.

24. A release liner as recited in claim 8 wherein said second layer comprises condenser tissue or parchment paper.

25. A release liner as set forth in claim 8 wherein said cellulose or cellulose-derivative fibers are cotton, vegetable, cellulose acetate, or rayon fibers, or mixtures thereof, or with wood fibers.

26. A release liner as set forth in claim 13 wherein said cellulose or cellulose-derivative fibers are cotton, vegetable, cellulose acetate, or rayon fibers, or mixtures thereof, or with wood fibers.

* * * * *